United States Patent
Matsunami

(10) Patent No.: US 7,371,673 B2
(45) Date of Patent: May 13, 2008

(54) METHOD AND APPARATUS FOR ATTACHING AN IC PACKAGE TO A PCB ASSEMBLY

(75) Inventor: Akira Matsunami, Beppu (JP)

(73) Assignee: Texas Instruments Incorporated, Dallas, TX (US)

( * ) Notice: Subject to any disclaimer, the term of this patent is extended or adjusted under 35 U.S.C. 154(b) by 155 days.

(21) Appl. No.: 11/130,662

(22) Filed: May 17, 2005

(65) Prior Publication Data

US 2006/0263929 A1 Nov. 23, 2006

(51) Int. Cl.
*H01L 21/44* (2006.01)

(52) U.S. Cl. ............... 438/612; 257/730; 257/738

(58) Field of Classification Search ........... 438/6, 438/10, 104, 107–114, 118, 121–123, 128–129, 438/135, 142, 145, 149, 151, 157, 176, 478, 438/184, 193, 195–198, 200–203, 206–207, 438/209–211, 218, 237, 165, 294, 308, 337, 438/353
See application file for complete search history.

(56) References Cited

U.S. PATENT DOCUMENTS

| | | | | |
|---|---|---|---|---|
| 6,153,505 A | * | 11/2000 | Bolde et al. | ............ 438/613 |
| 6,521,530 B2 | * | 2/2003 | Peters et al. | ............ 438/667 |
| 6,689,678 B2 | * | 2/2004 | James et al. | ............ 438/612 |
| 6,774,497 B1 | * | 8/2004 | Qi et al. | ............ 257/783 |
| 2002/0076919 A1 | * | 6/2002 | Peters et al. | ............ 438/637 |
| 2003/0096453 A1 | * | 5/2003 | Wang et al. | ............ 438/108 |
| 2005/0090040 A1 | * | 4/2005 | Geng et al. | ............ 438/106 |
| 2006/0263929 A1 | * | 11/2006 | Matsunami | ............ 438/106 |

\* cited by examiner

*Primary Examiner*—Michael Lebentritt
*Assistant Examiner*—Andre' Stevenson
(74) *Attorney, Agent, or Firm*—Tum Thach; Wade J. Brady, III; Frederick J. Telecky, Jr.

(57) ABSTRACT

A technique for attaching solder balls of a BGA to a PCB. In one example embodiment, this is accomplished by applying solder paste onto at least one of a plurality of contact pads on a PCB. At least one of a plurality of solder balls of an IC device are then onto the at least one of the plurality of contact pads on the PCB. The temperature is then increased to reflow the solder paste. The IC device is then pulled away from the PCB as a function of a geometric shape of the IC device and held in a new position upon reflowing the solder paste to transform the at least one of the plurality of solder balls and the reflowed solder paste into a high shear strength solder joint structure. The reflow temperature is then lowered to room temperature to attach the high shear strength solder joint structure to the at least one of the plurality of lands on the PCB.

13 Claims, 4 Drawing Sheets

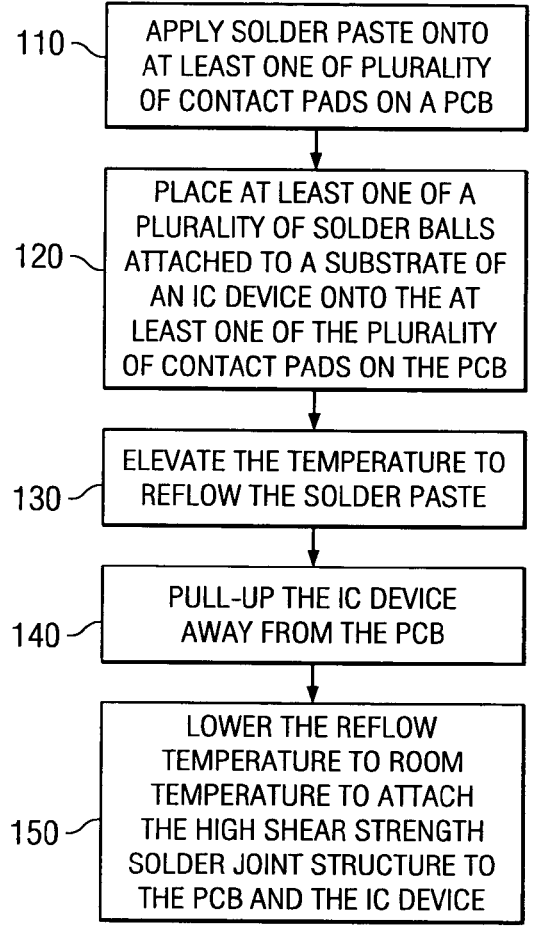
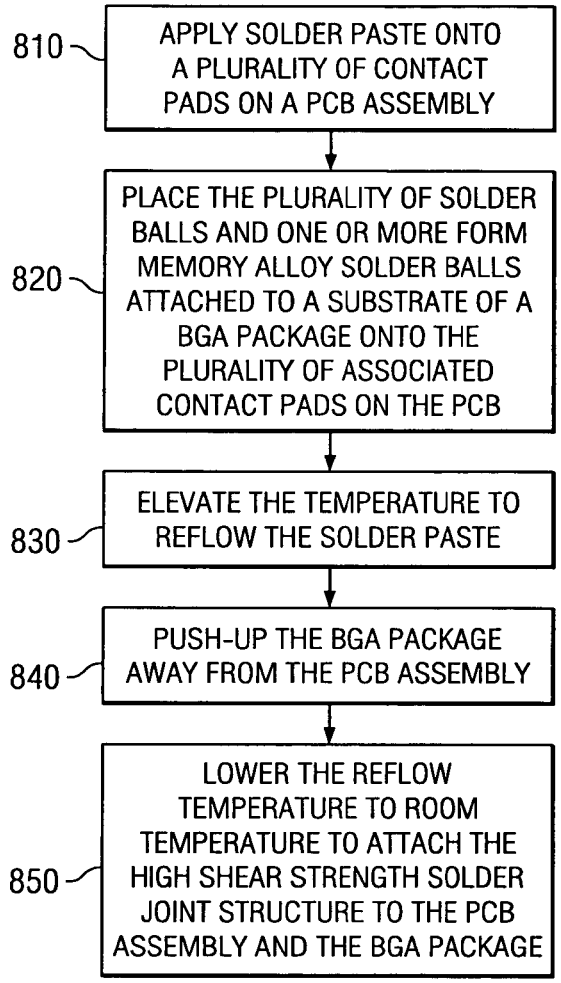
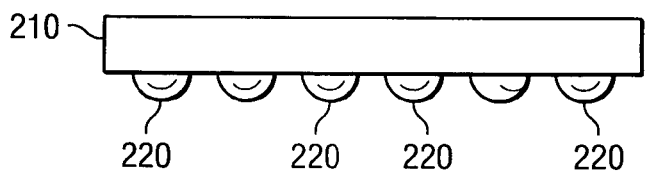

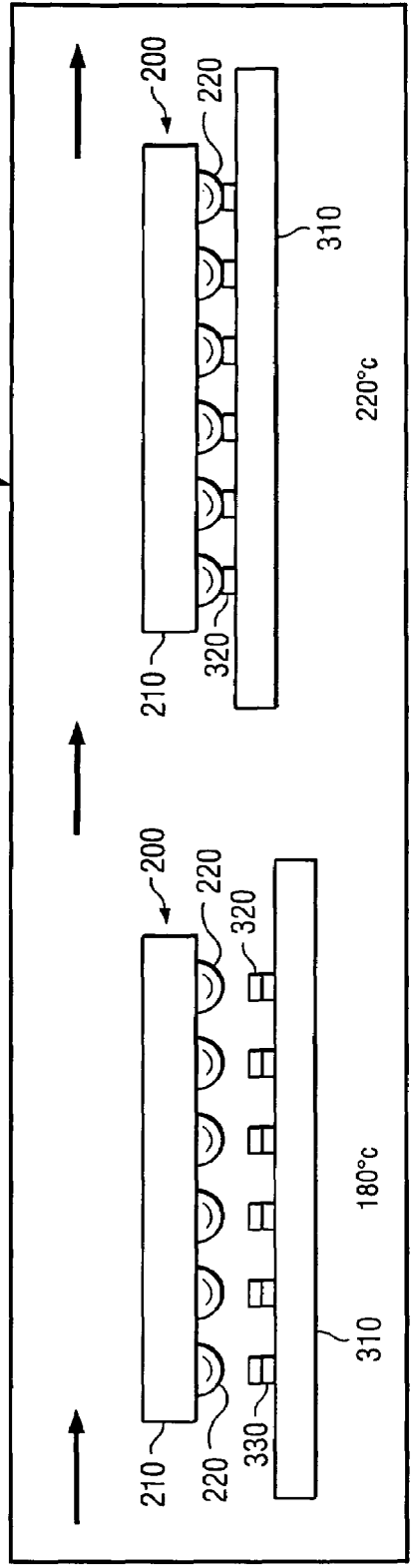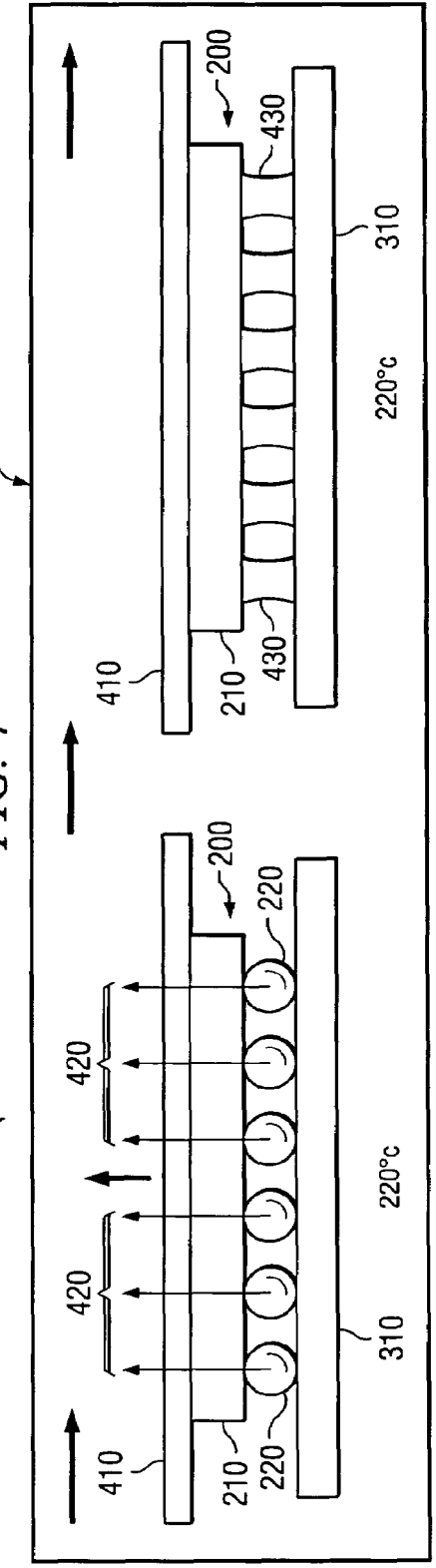

METHOD AND APPARATUS FOR ATTACHING AN IC PACKAGE TO A PCB ASSEMBLY

TECHNICAL FIELD OF THE INVENTION

The present invention relates generally to printed circuit board assembly, and more particularly relates to interconnection of semiconductor packages to a printed circuit board (PCB) assembly.

BACKGROUND OF THE INVENTION

Many electronic systems include a printed circuit board with several integrated circuit devices connected to the PCB. Frequently, these integrated circuit devices are connected to the PCB by solder. For example, integrated circuit devices, such as ball grid arrays (BGAs) are utilized in a circuit along with other electronic components that are connected to the PCB by solder. BGAs typically include at least one solder ball arranged between the integrated circuit device and the printed circuit board at each contact so as to electrically connect the integrated circuit device to the circuit board.

The solder balls are attached to an associated plurality of conductive surface pads located on the bottom surface of the ball grid array (BGA) package. The BGA package including the solder balls and the solder paste are placed onto the PCB, wherein the solder balls and solder paste are reflowed to form BGA joints, which in turn attach the BGA package to the PCB.

BGAs have become quite prevalent in the commercial electronics industry, and many useful devices are packaged in this manner. In general, BGA joints do not offer the life and reliability that is required in the commercial electronics industry, due to the fact that, because of their dumpling shape, the BGA joints are not pliant enough to absorb mechanical shock, such as those experienced by an accidental dropping of a cell phone. This can result in solder ball damage on either the bottom surface of the BGA package side or the PCB side, which in-turn can result in disjoining the BGA from the PCB.

One method aims to improve the BGA joint reliability by changing substrate plating to, such as Ni plating, on the bottom surface of the BGA package to strengthen the BGA joint. However, this method does not address the underlying problem of the relatively low height and dumpling shape of BGA joints, which results in a lower shear strength solder joint structure.

SUMMARY OF THE INVENTION

According to an aspect of the present invention there is provided a method for attaching solder balls located underneath a substrate of an integrated circuit (IC) device to conductive pads located on either of the bottom surface of the IC device and the PCB. The method including the steps of applying solder paste onto at least one of a plurality of contact pads on the PCB, placing at least one of a plurality of solder balls underneath a substrate of the IC device onto the at least one of the plurality of contact pads on the PCB, elevating the temperature to reflow the solder paste, pulling the IC device away from the PCB as a function of a geometric shape of the IC device and holding the IC device in a new position upon reflowing the solder paste to transform the at least one of the plurality of solder balls and the reflowed solder paste into a high shear strength solder joint structure, and lowering the reflow temperature to room temperature, thereby attaching the high shear strength solder joint structure to the at least one of the plurality of lands on the PCB and the substrate of the IC device.

According to another aspect of the present invention there is provided a method for attaching solder balls of a BGA to conductive pads located on either of the bottom surface of the BGA package and the PCB. The method including the steps of applying solder paste onto a plurality of contact pads on the PCB assembly, placing the plurality of solder balls of the BGA package onto the plurality of contact pads on the PCB assembly, elevating the temperature to reflow the solder paste, pulling-up the BGA package from the PCB assembly as a function of the height of the BGA package and holding the BGA package in a new position upon reflowing the solder paste to transform the plurality of solder balls and the reflowed solder paste into high shear strength solder joint structures, and lowering the reflow temperature to room temperature, thereby attaching the high shear strength solder joint structures to the plurality of lands on the PCB assembly.

According to another aspect of the present invention there is provided a method for attaching a plurality of solder balls and one or more form memory alloy solder balls located underneath a BGA package between conductive pads located on a bottom surface of the BGA package and a PCB assembly, the method including the steps of applying solder paste onto to a plurality of associated contact pads on the PCB assembly, placing the plurality of solder balls and the one or more form memory alloy solder balls of the BGA package onto the plurality of associated contact pads on the PCB assembly, elevating the temperature to reflow the solder paste, pushing-up the BGA package from the PCB assembly as a function of the height of BGA package and holding the BGA package in a new position by the one or more form memory alloy solder balls upon reflowing the solder paste to transform the plurality of solder balls and the reflowed solder paste into high shear strength solder joint structures, and lowering the reflow temperature to room temperature, thereby attaching the high shear strength solder joint structures to the plurality of lands on the PCB assembly.

According to another aspect of the present invention there is provided an electronic assembly, wherein the electronic assembly includes an IC package, which has a front side and a back side, the front side is disposed across from the back side, and the front side has a plurality of high shear strength solder joint structures. The electronic assembly further includes a PCB assembly, which has a plurality of associated contact pads that are attached to the plurality of drum like solder structures.

According to another aspect of the present invention there is provided a PCB assembly, the PCB assembly includes a PCB, which has a grid of connecting pads. The PCB assembly further includes a BGA package, which has an associated grid of high shear strength solder joint structures underneath that are attached to the grid of connecting pads on the PCB.

BRIEF DESCRIPTION OF THE DRAWINGS

FIG. 1 is a flowchart illustrating an example method of attaching solder balls of a BGA to conductive pads located on either of the bottom surface of the BGA package and the PCB according to an embodiment of the present invention.

FIGS. 2-4 are sequential processing steps of FIG. 1, showing attaching solder balls of a BGA to conductive pads located on either of the bottom surface of the BGA package and the PCB according to an embodiment of the present invention.

FIG. 8 is a flowchart illustrating another example method of attaching solder balls of a BGA to conductive pads located on either of the bottom surface of the BGA package and the PCB according to an embodiment of the present invention.

DETAILED DESCRIPTION OF THE INVENTION

Figure 5:
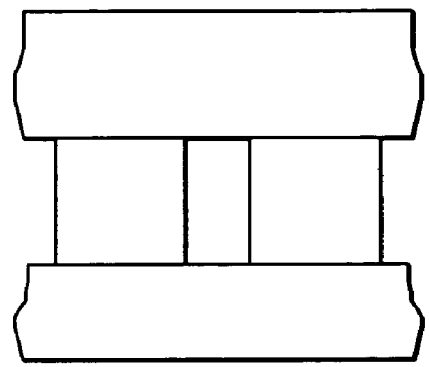
FIGS. 5-7 illustrate high shear strength solder joint structures formed after reflowing the IC assembly according to various embodiments of the present invention.

In the following detailed description of the embodiments of the invention, reference is made to the accompanying drawings that form a part hereof, and in which are shown by way of illustration specific embodiments in which the invention may be practiced. These embodiments are described in sufficient detail to enable those skilled in the art to practice the invention, and it is to be understood that other embodiments may be utilized and that changes may be made without departing from the scope of the present invention. The following detailed description is, therefore, not to be taken in a limiting sense, and the scope of the present invention is defined only by the appended claims.

The terms "substrate" and "printed circuit board" are used interchangeably throughout the document. Further, the terms "IC device" and "IC package" are used interchangeably throughout the document. Furthermore, the terms "BGA" and "BGA package" are used interchangeably throughout the document. The ensuing description deals with "solder" balls, drum and/or column shaped solder structures, solder flux, and the like. However, this should not be taken to limit the invention strictly to solder. Other well-known materials used for making connections in BGAs, like ceramics and plastics, may be used, as well; in such cases, analogous techniques for attaching solder balls would be substituted accordingly.

FIG. 1 is a flowchart illustrating an example embodiment of a method 100 for attaching solder balls located underneath a substrate of an integrated circuit (IC) device to conductive pads located on either of the bottom surface of the IC device and the PCB. At step 10, the method 100 in this example embodiment applies solder paste onto the at least one of a plurality of contact pads on a PCB. The solder paste is applied onto the plurality of contact pads on the PCB using known conventional techniques. In some embodiments, the solder paste is applied onto a plurality of contact pads located on a PCB assembly.

At step 120, at least one of a plurality of solder balls attached to a substrate of an IC device is placed onto the at least one of the plurality of contact pads on the PCB. In some embodiments, the IC device is a BGA. In these embodiments, the plurality of solder balls attached to the substrate of the BGA package is placed onto the plurality of contact pads on the PCB assembly.

Referring now to FIG. 2, the block diagram illustrates an example embodiment of a BGA package 200. Exemplary BGA packages include micro BGA (µBGA) and new fine-pitch BGA (nFBGA). As shown in FIG. 2, the BGA package 200 includes the substrate 210 and the plurality of solder balls 220 attached underneath the substrate 210.

At step 130, the solder paste disposed on the plurality of contact pads is reflowed by elevating the temperature to a reflow temperature in a reflow oven. Referring now to FIG. 3, there is illustrated the placing of the plurality of solder balls 220 attached underneath the substrate 210 of the BGA package 210 onto the solder paste 330 disposed on the plurality of contact pads 320 located on the PCB 310. Further as shown in FIG. 3, the BGA package 200 along with the PCB 310 is reflowed in the infrared (IR)-reflow oven 330 by raising the temperature gradually from 180° C. to the reflow temperature of 220° C. In some embodiments, the reflow temperature can be as high as about 250° C.

Figure 6:
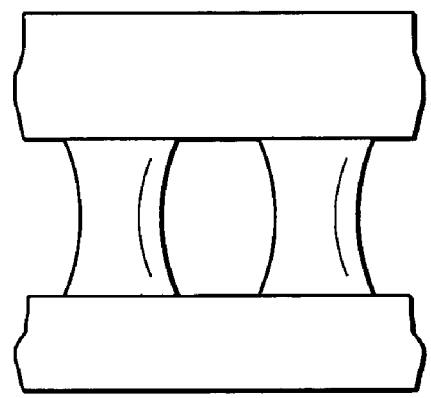
Figure 7:
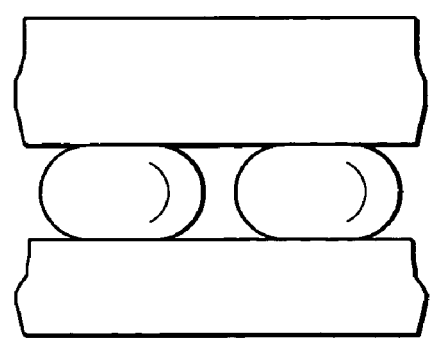

At step 140, the IC device is pulled away from the PCB as a function of a geometric shape of the IC device and held in a new position upon reflowing the solder paste to transform the at least one of the plurality of solder balls and the reflowed solder paste into a high shear strength solder joint structure. In some embodiments, the IC device is pulled-up from the PCB as a function of a height of the IC device and it is held in the new position upon reflowing the solder paste to transform the at least one of the plurality of solder balls and the reflowed solder paste into a high shear strength solder joint structure. Exemplary high shear strength solder joint structures include a drum shaped solder joint structure 500 as shown in FIG. 5, an inward curved shaped solder joint structure 600 as shown in FIG. 6, and a outward shaped solder joint structure 700 as shown in FIG. 7. Further, exemplary drum shaped solder joint structure includes a cylindrical shaped solder joint structure and a column shaped solder joint structure. The transformed solder joint structure provides higher shear strength by retaining a wider cross sectional area at stress points, such as a solder joint between the substrate of the IC device and the solder joint structure and a solder joint between the PCB and the solder joint structure.

In some embodiments, a chuck board is attached to the IC device. A lifting mechanism is used to pull-up the chuck board such that the IC device is at the new position. The chuck board along with the IC device is then held in the new position. In one embodiment, the lifting mechanism has a mechanical moving means which holds the IC unit using techniques, such as an anti-heat resist adhesive tape and/or vacuum.

Referring now to FIG. 4, there is illustrated a block diagram of pulling the BGA 200 away from the PCB 310 in a direction 420 to transform the plurality of solder balls 220 to drum shaped solder joint structures 430. Also shown in FIG. 4, is a chuck board 410 that is attached to the substrate 210 of the BGA 200, which facilitates in lifting the BGA 200 in the direction 420 and holding the BGA 200 in the new position to form the drum shaped solder joint structure 430.

At step 150, the reflow temperature is lowered to room temperature, while holding the IC device in the new position to attach the formed high shear strength solder joint structure to the at least one of the plurality of lands on the PCB and the substrate of the IC device.

FIG. 8 is a flowchart illustrating an example embodiment of a method 800 for attaching solder balls and one or more form memory alloy solder balls located underneath a substrate of a BGA package to conductive pads located on either of the bottom surface of the BGA package and the PCB assembly. The form memory alloy can be any metal alloy that expands and facilitates in lifting the BGA package upon heating the solder paste and the form memory alloy to a reflow temperature. At step 810, the method 800 in this example embodiment applies solder paste onto an associated plurality of contact pads on the PCB assembly. In these embodiments, the solder paste is applied onto the plurality of contact pads on the PCB assembly using known conventional techniques.

Figure 9:
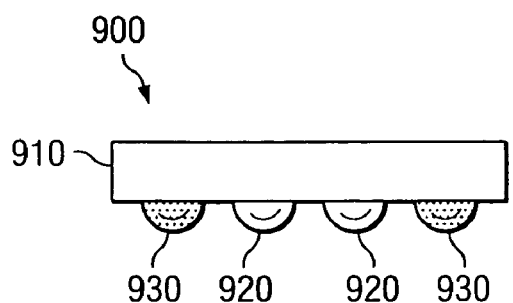
FIGS. 9-11 are sequential processing steps of FIG. 8, showing attaching solder balls of a BGA to conductive pads located on either of the bottom surface of the BGA package and the PCB according to an embodiment of the present invention.

At step 820, the plurality of solder balls and the one or more form memory alloy solder balls attached to the substrate of the BGA package is placed onto the at least one of the plurality of contact pads on the PCB assembly. Referring now to FIG. 9, the block diagram illustrates an example embodiment of a BGA package 900 including a plurality of solder balls 920 and one or more form memory alloy solder balls 930. Exemplary BGA packages include μBGA and nFBGA. As shown in FIG. 2, the BGA package 200 includes the substrate 910, the plurality of solder balls 920, and the one or more form memory alloy solder balls 930 attached underneath the substrate 910.

Figure 10:
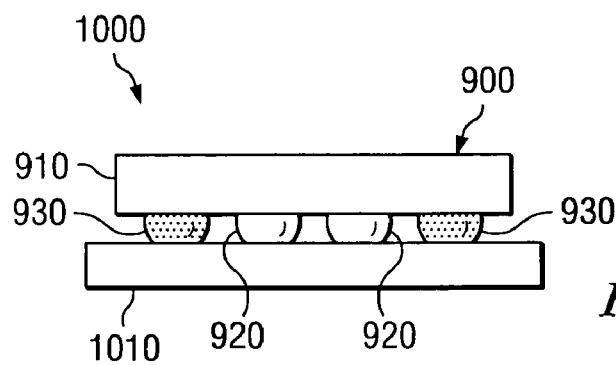

At step 830, the solder paste disposed on the plurality of contact pads is reflowed by elevating the temperature to a reflow temperature in a reflow oven. Referring now to FIG. 10, there is illustrated a block diagram 1000 that shows the placed plurality of solder balls 920 and the one or more form memory alloy solder balls 930 that are attached underneath the substrate 910 of the BGA package 900 on the solder paste disposed on the plurality of contact pads located on the PCB 1010. In these embodiments, the BGA package 900 along with the PCB 1010 is reflowed in the IR-reflow oven by raising the temperature gradually from 180° C. to the reflow temperature of 220° C. In some embodiments, the reflow temperature can be as high as about 250° C.

Figure 11:
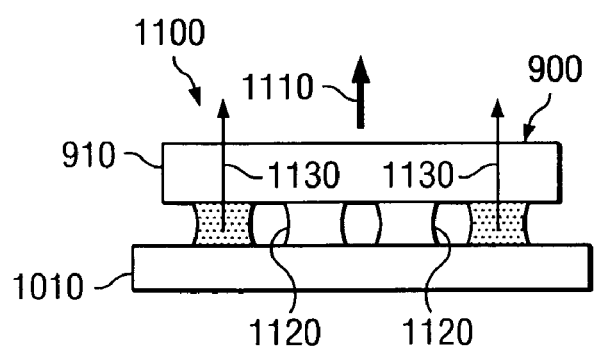
Figure 12:
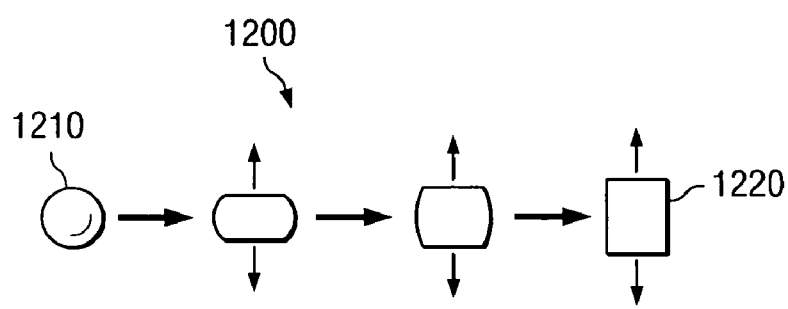
FIG. 12 is a block diagram illustrating the transformation of the solder ball to a high shear strength solder joint structure taking place during reflow according to the example flowchart shown in FIG. 8.

At step 840, the BGA package is pushed-up as a function of the height of the BGA package and held in a new position by the one or more for memory alloy solder balls upon reflowing the solder paste. Referring now to FIG. 11, there is illustrated a block diagram 1100 of pushing up the BGA package 900 away from the PCB 1010 in a direction 1110 by the one or more form memory alloy solder balls 930 (shown in FIGS. 9 and 10) to transform the plurality of solder balls 920 (shown in FIGS. 9 and 10) to drum shaped solder joint structures 1120. It can be seen in FIG. 11 that the one or more form memory alloy solder balls 930 expands in an upward direction and provides the necessary upward force 1130 to push-up the BGA package 900 in the direction 1110 upon reflowing the solder paste. Referring now to FIG. 12, it can be seen in the block diagram 1200 that the solder ball 1210 is gradually transformed by pushing up the BGA package 900 in the direction 1110 (shown in FIG. 11) into a high shear strength solder joint structure 1220 during the reflow process.

At step 850, the reflow temperature is lowered to room temperature, while the BGA package is held in the new position to attach the formed high shear strength solder joint structure to the at least one of the plurality of lands on the PCB assembly and the substrate of the BGA package.

The above-described methods and apparatus provide various techniques to attach a BGA to a PCB assembly. The above process controls solder ball joint shape actively during the PCB assembly process and not in the IC assembly process. The above process improves shear strength by changing the ball joint shape from a dumpling shaped solder structure to a drum and/or column like shaped solder structure. It can be envisioned that the drum shaped solder structure can be shaped to have a cylindrical outer shape, inward curved outer shape, outward curved outer shape, and the like.

It is to be understood that the above description is intended to be illustrative, and not restrictive. Many other embodiments will be apparent to those of skill in the art upon reviewing the above description. The scope of the subject matter should, therefore, be determined with reference to the following claims, along with the full scope of equivalents to which such claims are entitled.

As shown herein, the present invention can be implemented in a number of different embodiments, including various methods, an apparatus, and a system. Other embodiments will be readily apparent to those of ordinary skill in the art. The elements, algorithms, and sequence of operations can all be varied to suit particular requirements. The operations described above with respect to the method illustrated in FIGS. 1 and 8 can be performed in a different order from those shown and described herein.

FIGS. 1-12 are merely representational and are not drawn to scale. Certain proportions thereof may be exaggerated, while others may be minimized. FIGS. 1-12 illustrate various embodiments of the invention that can be understood and appropriately carried out by those of ordinary skill in the art.

It is emphasized that the Abstract is provided to comply with 37 C.F.R. § 1.72(b) requiring an Abstract that will allow the reader to quickly ascertain the nature and gist of the technical disclosure. It is submitted with the understanding that it will not be used to interpret or limit the scope or meaning of the claims.

In the foregoing detailed description of the embodiments of the invention, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the detailed description of the embodiments of the invention, with each claim standing on its own as a separate preferred embodiment.

The above description is intended to be illustrative, and not restrictive. Many other embodiments will be apparent to those skilled in the art. The scope of the invention should therefore be determined by the appended claims, along with the full scope of equivalents to which such claims are entitled.

The invention claimed is:

1. A method comprising:
    applying solder paste onto at least one of a plurality of contact pads on a PCB;
    placing at least one of a plurality of solder balls attached to a substrate of an IC device onto the at least one of the plurality of contact pads on the PCB;
    elevating the temperature to reflow the solder paste;
    using a lifting mechanism to pull the IC device away from the PCB as a function of a geometric shape of the IC device and holding the IC device in a new position upon reflowing the solder paste to transform the at least one of the plurality of solder balls and the reflowed solder paste into a high shear strength solder joint structure; and
    lowering the reflow temperature to room temperature, thereby attaching the high shear strength solder joint structure to the at least one of the plurality of lands on the PCB and the substrate of the IC device.

2. The method of claim 1, wherein pulling the IC device away from the PCB as a function of the geometry of the IC device and holding the IC device in the new position comprises:
pulling-up the IC device away from the PCB as a function of a height of the IC device and holding the IC device in the new position.

3. The method of claim 1, wherein holding the IC device in the new position comprises:
attaching the IC device to a chuck board;
using the lifting mechanism to pull-up the chuck board such that the IC device is at the new position; and
holding the chuck board such that the IC device is in the new position.

4. The method of claim 1, wherein, in pulling the IC device to transform the at least one of the plurality of solder balls to the high shear strength solder joint structure, the high shear strength solder joint structure comprises a solder structure selected from the group consisting of a drum shaped solder joint structure, a cylindrical shaped solder joint structure, a column shaped solder joint structure, an inward curved shaped joint structure, and a outward curved shaped joint structure.

5. The method of claim 1, wherein, in placing at least one of the plurality of solder balls of the IC device, the IC device is a BOA.

6. The method of claim 1, wherein, in elevating the temperature to reflow the solder paste, the elevated reflow temperature is in the range of about 1800 C to about 250° C.

7. A method for attaching a plurality of solder balls of a BGA package between conductive pads located on a bottom surface of the BGA package and a PCB assembly comprising:
applying solder paste onto a plurality of contact pads on the PCB assembly;
placing the plurality of solder balls of the BGA package onto the plurality of contact pads on the PCB assembly;
elevating the temperature to reflow the solder paste;
using a lifting mechanism to pull up the BGA package from the PCB assembly as a function of the height of the BGA package and holding the BGA package in a new position upon reflowing the solder paste to transform the plurality of solder balls and the reflowed solder paste into high shear strength solder joint structures; and
lowering the reflow temperature to room temperature, thereby attaching the high shear strength solder joint structures to the plurality of lands on the PCB assembly.

8. The method of claim 7, wherein, in pulling-up the BGA package from the PCB assembly to transform the plurality of solder balls to the high shear strength solder joint structures, the high shear strength solder joint structures comprise solder structures selected from the group consisting of a drum shaped solder joint structures, cylindrical shaped solder joint structures, column shaped solder joint structures, inward curved shaped joint structures, and outward curved shaped joint structures.

9. The method of claim 7, wherein, in elevating the temperature to reflow the solder paste, the elevated reflow temperature is in the range of about 1800 C to about 250° C.

10. The method of claim 7, wherein holding the BOA package in the new position comprises:
attaching the BGA package to a chuck board;
using the lifting mechanism to pull-up the chuck board such that the BGA package is at the new position; and
holding the chuck board such that the BOA package is in the new position.

11. A method for attaching a plurality of solder balls and one or more form memory alloy solder balls located underneath a substrate of a BGA package between conductive pads located on a bottom surface of the BOA package and a PCB assembly comprising:
applying solder paste onto a plurality of associated contact pads on the PCB assembly;
placing the plurality of solder balls and the one or more form memory alloy solder balls attached to the substrate of the BOA package onto the plurality of associated contact pads on the PCB assembly;
elevating the temperature to reflow the solder paste;
using a lifting mechanism to push up the BGA package away from the PCB assembly as a function of the height of the BGA package and holding the BOA package in a new position by the one or more form memory alloy solder balls upon reflowing the solder paste to transform the plurality of solder balls and the reflowed solder paste into high shear strength solder joint structures; and
lowering the reflow temperature to room temperature, thereby attaching the high shear strength solder joint structures to the plurality of lands on the PCB assembly and the substrate of the BGA package.

12. The method of claim 11, wherein, in pushing-up the BOA package from the PCB assembly to transform the plurality of solder balls to the high shear strength solder joint structures, the high shear strength solder joint structures comprise solder structures selected from the group consisting of a drum shaped solder joint structures, cylindrical shaped solder joint structures, column shaped solder joint structures, inward curved shaped joint structures, and outward curved shaped joint structures.

13. The method of claim 11, wherein, in elevating the temperature to reflow the solder paste, the elevated reflow temperature is in the range of about 1800 C to about 250° C.

* * * * *